(12) United States Patent
Zhao

(10) Patent No.: US 10,978,679 B2
(45) Date of Patent: Apr. 13, 2021

(54) METHOD OF MANUFACTURING COMPOSITE FILM LAYER AND DISPLAY DEVICE

(71) Applicant: Wuhan China Star Optoelectronics Semiconductor Display Technology Co., Ltd., Wuhan (CN)

(72) Inventor: Chen Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,958

(22) PCT Filed: Feb. 25, 2019

(86) PCT No.: PCT/CN2019/076058
§ 371 (c)(1),
(2) Date: May 22, 2019

(87) PCT Pub. No.: WO2020/118905
PCT Pub. Date: Jun. 18, 2020

(65) Prior Publication Data
US 2020/0194731 A1 Jun. 18, 2020

(30) Foreign Application Priority Data
Dec. 12, 2018 (CN) .......................... 201811516497.7

(51) Int. Cl.
*H01L 51/56* (2006.01)
*H01L 27/32* (2006.01)
*H01L 51/52* (2006.01)

(52) U.S. Cl.
CPC ............ *H01L 51/56* (2013.01); *H01L 27/323* (2013.01); *H01L 51/5293* (2013.01);
(Continued)

(58) Field of Classification Search
CPC ... H01L 51/56; H01L 27/323; H01L 51/5293; H01L 2251/301; H01L 2251/5338; H01L 2251/56
(Continued)

(56) References Cited

U.S. PATENT DOCUMENTS 3,818,279 A * 6/1974 Seeger, Jr. ............. H05K 1/118
361/751
5,936,850 A * 8/1999 Takahashi ........... G02F 1/13452
361/784
(Continued)

FOREIGN PATENT DOCUMENTS

CN    102610534    *  7/2012  ......... H01L 2224/18
CN    107815109    *  3/2018  ......... C08G 73/1021

OTHER PUBLICATIONS

English Machine Translation of CN 102610534 (Year: 2012).*
English Machine Translation of CN 107815109 (Year: 2018).*

*Primary Examiner* — Dzung Tran

(57) ABSTRACT

A method of manufacturing a composite film layer applicable to a flexible display panel includes providing a transparent substrate film; forming a deformed state of the transparent substrate film by applying a predetermined degree of tensile stress to the transparent substrate film; forming a hardened layer on the transparent substrate film in the deformed state; and releasing the tensile stress from the transparent substrate film in the deformed state to enable a molecular chain in the hardened layer to contract.

5 Claims, 4 Drawing Sheets

(52) U.S. Cl.
CPC .................. *H01L 2251/301* (2013.01); *H01L 2251/5338* (2013.01); *H01L 2251/56* (2013.01)

(58) Field of Classification Search
USPC .......................................... 257/40
See application file for complete search history.

(56) References Cited

U.S. PATENT DOCUMENTS

| | | | |
|---|---|---|---|
| 2005/0280157 A1* | 12/2005 | Roush ................. | H05K 3/4691 257/773 |
| 2006/0169989 A1* | 8/2006 | Bhattacharya ........ | H01L 21/469 257/79 |
| 2010/0123686 A1* | 5/2010 | Klinghult .............. | G06F 3/0412 345/178 |
| 2010/0330338 A1* | 12/2010 | Boyce .................... | B29C 59/02 428/156 |
| 2014/0000682 A1* | 1/2014 | Zhao ................... | H01L 31/0481 136/251 |
| 2018/0224340 A1* | 8/2018 | Koppal ............... | G02F 1/13452 |

* cited by examiner

METHOD OF MANUFACTURING COMPOSITE FILM LAYER AND DISPLAY DEVICE

RELATED APPLICATIONS

This application is a National Phase of PCT Patent Application No. PCT/CN2019/076058 having International filing date of Feb. 25, 2019, which claims the benefit of priority Chinese Patent Application No. 201811516497.7 filed on Dec. 12, 2018. The contents of the above applications are all incorporated by reference as if fully set forth herein in their entirety.

FIELD AND BACKGROUND OF THE INVENTION

1

The present invention relates to a display field, and particularly, to a method of manufacturing a composite film layer for a display panel and a display device.

2

With development of display technology, standards for color and lightness are getting higher and higher. Active matrix organic light emitting diodes (AMOLEDs) gradually enter consumer electronic markets of mobile devices and televisions. Organic light emitting diode (OLED) displays have advantages of high brightness, wide viewing angles, quick response times, ultra-thinness, light weight, and capability of being formed on flexible substrates. In comparison with traditional thin film transistor-liquid crystal display (TFT-LCD) technology, the biggest advantage of an OLED is that it can be made into a flexible product. Researchers in the industry have made a great effort on flexible materials in order to achieve bendable and curling properties of OLEDs. Cover windows are outermost layers of flexible foldable displays and should have characteristics of both high hardness and bending resistance. However, current studies found that hardness and bending resistance of cover windows are inversely proportional to each other, that is, cover widows of high hardness are poor in bending and are prone to cause cracks or fractures when bending outwards, while cover windows of great bendability have very low hardness.

SUMMARY OF THE INVENTION

An object of the present invention is to provide a method of manufacturing a composite film layer for a display panel to improve bending performance and increase compactness of a film in a state that the film is flat, so that the film is less likely to crack or break when the display panel is bent.

To achieve the above-mention object, the present invention provides a method of manufacturing a composite film layer for a flexible display panel, the method comprising: providing a transparent substrate film; forming, by applying a predetermined degree of tensile stress to the transparent substrate film, a deformed state of the transparent substrate film; forming a hardened layer on the transparent substrate film in the deformed state; and releasing the tensile stress from the transparent substrate film in the deformed state to enable a molecular chain in the hardened layer to contract, wherein the deformed state of the transparent substrate film is a stretched state or a bending state, the stretched state is formed by stretching outward to a periphery of the transparent substrate film, and the bending state is formed by bending the transparent substrate film.

In one embodiment of the present invention, the transparent substrate film is made of transparent polyimide paste, wherein the transparent polyimide paste is formed into a film by a dissolution and casting process, and the film is bidirectionally stretched and then imidized by heat treatment to form the transparent substrate film containing the transparent polyimide.

In another embodiment of the present invention, the hardened layer comprises a resin composition containing acrylate, coated on the transparent substrate film in the stretched state.

The present invention further provides a method of manufacturing a composite film layer for a flexible display panel, the method comprising providing a transparent substrate film; forming, by applying a predetermined degree of tensile stress to the transparent substrate film, a deformed state of the transparent substrate film; forming a hardened layer on the transparent substrate film in the deformed state; and releasing the tensile stress from the transparent substrate film in the deformed state to enable a molecular chain in the hardened layer to contract.

In another embodiment of the present invention, the deformed state of the transparent substrate film is a stretched state, formed by stretching outward to a periphery of the transparent substrate film.

In another embodiment of the present invention, the deformed state of the transparent substrate film is a bending state, formed by bending the transparent substrate film.

In another embodiment of the present invention, the transparent substrate film is made of transparent polyimide paste, wherein the transparent polyimide paste is formed into a film by a dissolution and casting process, and the film is bidirectionally stretched and then imidized by heat treatment to form the transparent substrate film containing the transparent polyimide.

In another embodiment of the present invention, the transparent substrate film has a thickness of 50 microns or 80 microns.

In another embodiment of the present invention, the hardened layer comprises a resin composition containing acrylate, coated on the transparent substrate film in the stretched state.

In another embodiment of the present invention, the hardened layer further comprises silica nanoparticles.

In another embodiment of the present invention, the composite film layer is formed on the display panel and functions as a flexible cover for the display panel.

The present invention further provides a display device, comprising a display panel and at least a composite film layer disposed on the display panel, wherein the at least a composite film layer comprises a transparent substrate film; and a hardened layer disposed on the transparent substrate film, wherein the transparent substrate film has a deformed state under a tensile stress, and the hardened layer is formed on the transparent substrate film when the transparent substrate film is in the deformed state, wherein the deformed state includes a stretched state or a bending state.

In one embodiment of the present invention, the display panel comprises a substrate, a functional layer, a light-emitting film layer, and a polarizer all laminated in sequence, and a touch panel is disposed on the display panel, wherein at least one of the substrate, the functional layer, the light-emitting film layer, the polarizer, and the touch panel includes the composite film layer.

In the method of manufacturing the composite film layer of the present invention, a predetermined degree of tension stress is applied to or released from the transparent substrate film during a process of manufacturing the composite film layer, enabling the transparent substrate film to be formed into a stretched state or a bending state, so that the hardened layer is formed on the transparent substrate film in a deformed state, thereby to improve bending resistance of the composite film. Furthermore, compactness of the film can be improved in a state where the composite film is flat, thereby to increase a surface hardness of the composite film and effectively overcome the problem that films of traditional flexible display panels are prone to cracks or fractures when bending.

DESCRIPTION OF SPECIFIC EMBODIMENTS OF THE INVENTION

Figure 1:
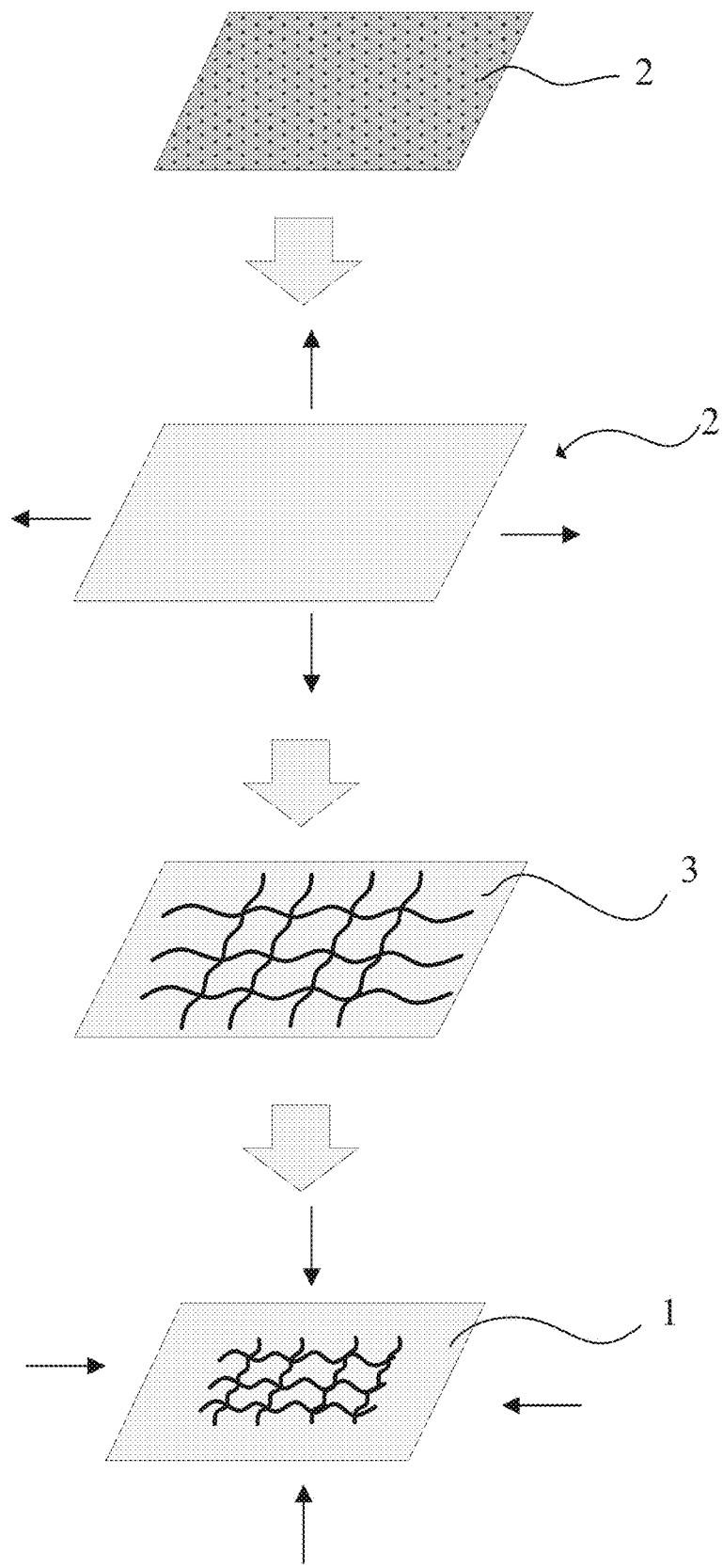
FIG. 1 is a schematic exploded view showing a method of manufacturing a composite film layer in accordance with a preferable embodiment of the present invention.

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

The present invention is directed to a method of manufacturing a composite film layer, and particularly, to a method of manufacturing a composite film layer for a display panel. In this preferable embodiment, the display panel is an organic light emitting diode display panel being flexible and bendable.

Figure 2:
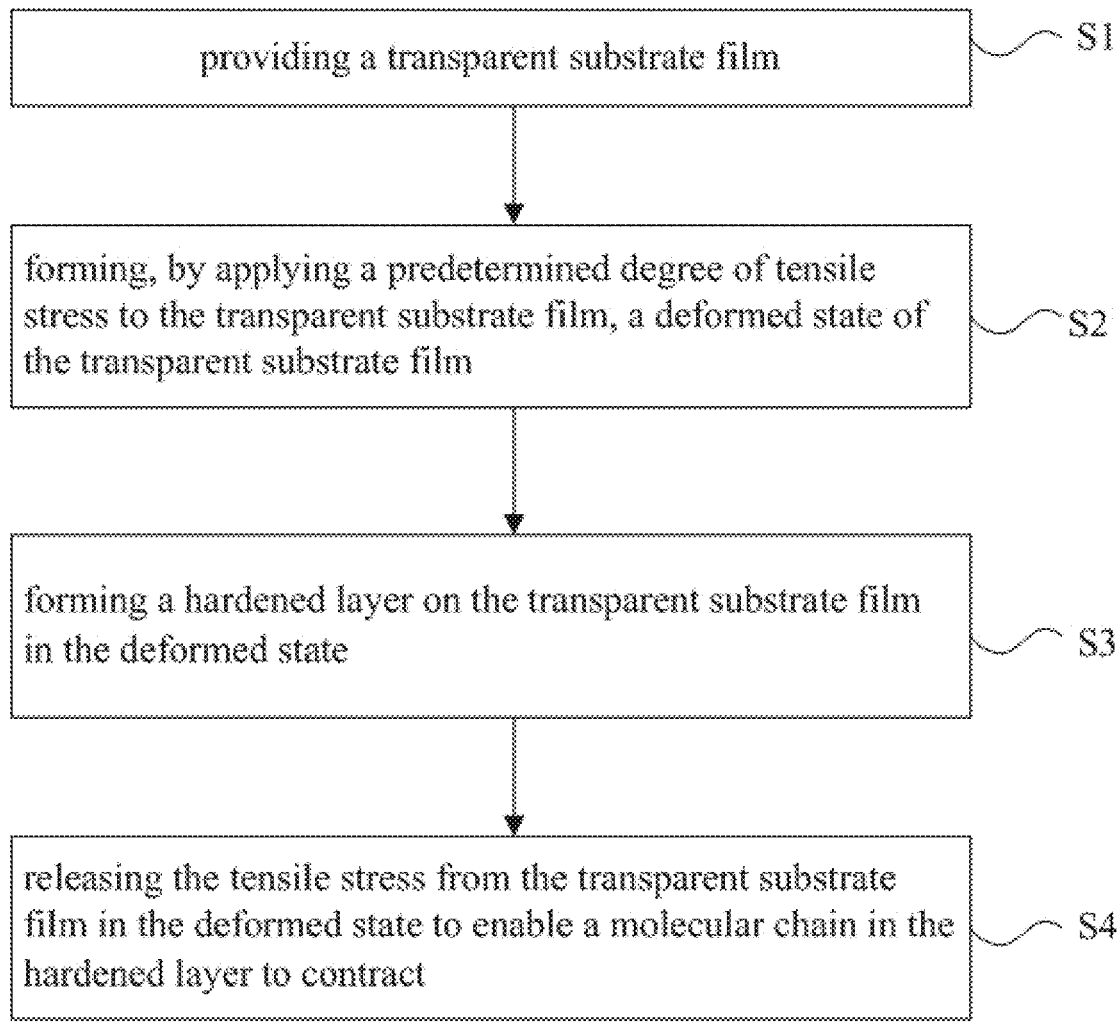
FIG. 2 is a flowchart of the method of manufacturing the composite film layer of FIG. 1.

FIG. 1 is a schematic exploded view showing a method of manufacturing a composite film layer in accordance with a preferable embodiment of the present invention. FIG. 2 is a flowchart of the method of manufacturing the composite film layer of FIG. 1. A method of manufacturing a composite film layer 1 of the present invention includes steps shown in FIG. 2: step S1: providing a transparent substrate film 2. Specifically, the transparent substrate film 2 is made of colorless polyimide (CPI) paste, wherein the transparent polyimide paste is formed into a film by general dissolution and a casting process. That is, the transparent polyimide paste is dissolved in a solvent, and the film is bidirectionally stretched and then is imidized by heat treatment to form a transparent substrate film containing the transparent polyimide, such that the transparent substrate film 2 is a CPI film.

Step S2: forming a deformed state of the transparent substrate film 2 by applying a predetermined degree of tensile stress to the transparent substrate film. Particularly, in the preferable embodiment, the deformed state is a stretched state 21 (as shown in FIG. 1), which is formed by stretching outward to a periphery of the transparent substrate film made of CPI with a predetermined degree of force, under a condition of not exceeding an elastic deformation range of the CPI film, so that the transparent substrate film 2 is formed into the stretched state 21. The purpose of forming the stretched state 21 is to stretch a molecular chain of the transparent polyimide in advance. In this embodiment, the transparent substrate film 2 has a thickness of 50 micrometers or 80 micrometers, but is not limited thereto.

Step S3: forming a hardened layer 3 containing a resin composition on the transparent substrate film 2 in the deformed state (as shown in FIG. 1). That is, the transparent substrate film 2 in the deformed state is coated with the resin composition. In a specific embodiment, the resin composition contains acrylate, or in another embodiment, the hardened layer 3 further includes silica nanoparticles.

Step S4: releasing the tensile stress from the transparent substrate film 2 in the deformed state to enable a molecular chain in the hardened layer 3 to contract, so that the transparent substrate film 2 returns to a flat state (as shown in FIG. 1). That is, releasing the tensile stress from the CPI film to enable the molecular chain in the hardened layer 3 to contract, thereby to increase the compactness of the film, which is beneficial to an increase in hardness of the film.

Figure 3:
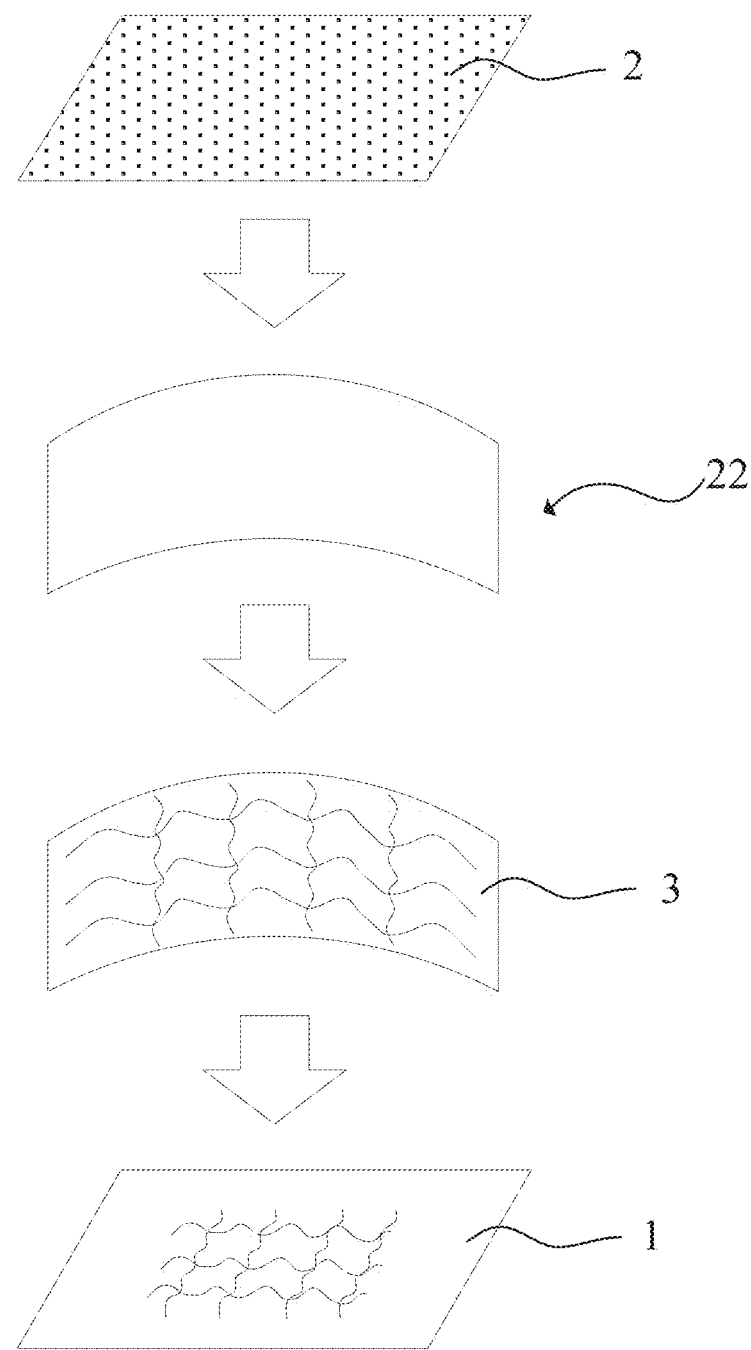
FIG. 3 is a schematic exploded view showing a method of manufacturing a composite film layer in accordance with another preferable embodiment of the present invention.

FIG. 3 is a schematic exploded view showing a method of manufacturing a composite film layer in accordance with another preferable embodiment of the present invention. An embodiment as shown in FIG. 3 is also performed by a method the same as that of manufacturing the composite film layer of FIG. 1 and including the step S1, step S2, step S3, and step S4. Details of the steps are not reiterated herein. Particularly, main differences between the embodiments of FIG. 3 and FIG. 1 are as follows: in the embodiment of FIG. 3, a deformed state in the step S2 is a bending state 22, that is, the bending state 22 is formed by bending the transparent substrate film 2 with a predetermined degree of tensile stress, under a condition of not exceeding an elastic deformation range of the CPI film, so that the transparent substrate film 2 is formed into the bending state. The purpose of forming the bending state 22 is to stretch a molecular chain of the transparent polyimide in advance.

Please continue referring to FIG. 3. The transparent substrate film 2 in the deformed state is coated with the resin composition to form a hardened layer 3. In the step S4, releasing the tensile stress from the CPI film in the bending state to enable the molecular chain in the hardened layer 3 to contract, thereby to increase the compactness of the film, which is beneficial to an increase in hardness of the film.

Figure 4:
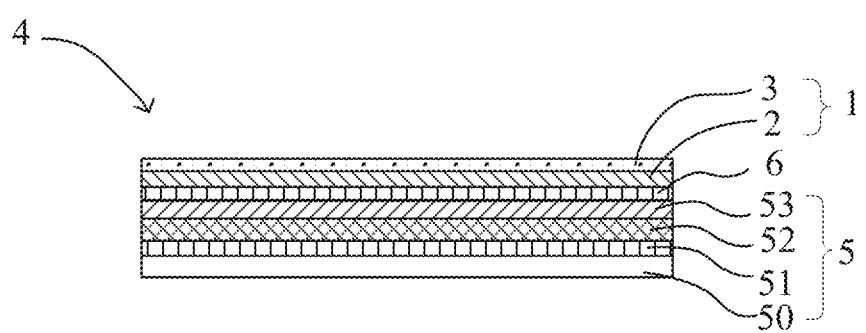
FIG. 4 is a schematic view of a display device in accordance with a preferable embodiment of the present invention.

FIG. 4 is a schematic view of a display device in accordance with a preferable embodiment of the present invention. The present invention further provides a display device 4, including a display panel 5 and at least a composite film layer 1 disposed on the display panel. The at least a composite film layer 1 includes a transparent substrate film 2 and a hardened layer 3 disposed on the transparent substrate film, wherein the transparent substrate film 2 has a deformed state under a tensile stress. The hardened layer 3 is formed on the transparent substrate film 2 when the transparent substrate film is in the deformed state. The transparent substrate film 2 is made of transparent polyimide, and the deformed state includes a stretched state and a bending state. Furthermore, the display panel 5 has a structure known as a structure of a conventional organic light emitting display panel. Specifically, as shown in FIG. 4, the display panel 5 includes a substrate 50, a functional layer 51 having, for example, a barrier layer and an insulating layer, a light-emitting film layer 52 having an anode layer, a light-emission layer, and a cathode layer, and a polarizer 53 that are all laminated in sequence. Furthermore, the display panel 5 may be provided with a touch panel 6, wherein at least one of the substrate 50, the functional layer 51, the light-emitting film layer 52, the polarizer 53, and the touch panel 6 includes a structure of the composite film layer.

Particularly, a composite film layer manufactured by the method of manufacturing the composite film layer of the present invention is formed on the display panel 5, that is, it is formed at the uppermost layer of the display panel 5 and functions as a flexible cover. However, the method of manufacturing the composite film layer of the present invention is also adopted to a fabrication of a polarizer or a barrier layer (not shown), for achieving a same purpose of increasing compactness and hardness of the composite film layer.

In the method of manufacturing the composite film layer of the present invention, a predetermined degree of tension stress is applied to or released from the transparent substrate film during a process of manufacturing the composite film layer, enabling the transparent substrate film to be formed into a stretched state or a bending state, so that the hardened layer is formed on the transparent substrate film in a deformed state, thereby to improve bending resistance of the composite film. Furthermore, compactness of the film can be improved in a state where the composite film is flat, thereby to increase surface hardness of the composite film and effectively overcome the problem that films of traditional flexible display panels are prone to cracks or fractures when bending.

It is understood that the invention may be embodied in other forms within the scope of the claims. Thus the present examples and embodiments are to be considered in all respects as illustrative, and not restrictive, of the invention defined by the claims.

What is claimed is:

1. A method of manufacturing a composite film layer for a flexible display panel, the method comprising:
   providing a transparent substrate film by forming transparent polyimide paste into a film through dissolution and a casting process, and bidirectionally stretching the film and performing heat treatment to imidize the film;
   forming, by applying a tensile stress to the transparent substrate film, a deformed state of the transparent substrate film;
   forming a hard coating layer on the transparent substrate film in the deformed state; and
   releasing the tensile stress from the transparent substrate film in the deformed state;
   wherein the deformed state of the transparent substrate film is a stretched state or a bending state, the stretched state is formed by stretching the transparent substrate film outward to a periphery of the transparent substrate film, and the bending state is formed by bending the transparent substrate film.

2. The method of manufacturing the composite film layer of claim 1, wherein the hard coating layer comprises a resin composition containing acrylate, coated on the transparent substrate film in the stretched state.

3. The method of manufacturing the composite film layer of claim 1, where the transparent substrate film has a thickness of 50 microns or 80 microns.

4. The method of manufacturing the composite film layer of claim 1, wherein the hard coating layer further comprises silica nanoparticles.

5. The method of manufacturing the composite film layer of claim 1, wherein the composite film layer is formed on the display panel and functions as a flexible cover for the display panel.

\* \* \* \* \*